United States Patent
Wetzel

(10) Patent No.: US 7,763,811 B2
(45) Date of Patent: Jul. 27, 2010

(54) HOUSING FOR AN ELECTRONIC CIRCUIT AND METHOD FOR SEALING THE HOUSING

(75) Inventor: Gerhard Wetzel, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 602 days.

(21) Appl. No.: 10/593,436

(22) PCT Filed: Mar. 4, 2005

(86) PCT No.: PCT/EP2005/050974

§ 371 (c)(1),
(2), (4) Date: Oct. 2, 2007

(87) PCT Pub. No.: WO2005/088709

PCT Pub. Date: Sep. 22, 2005

(65) Prior Publication Data

US 2008/0266821 A1 Oct. 30, 2008

(30) Foreign Application Priority Data

Mar. 16, 2004 (DE) .................. 10 2004 013 890
Apr. 30, 2004 (DE) .................. 10 2004 021 365

(51) Int. Cl.
*H01L 23/49* (2006.01)

(52) U.S. Cl. ............... 174/538; 174/536; 174/539; 361/752

(58) Field of Classification Search ............... 174/520, 174/521, 559, 564, 536, 538, 539; 257/787, 257/788; 361/752
See application file for complete search history.

(56) References Cited

U.S. PATENT DOCUMENTS 5,107,074 A 4/1992 Noll et al.
5,586,388 A * 12/1996 Hirao et al. ............... 29/830
5,943,558 A 8/1999 Kim et al.

FOREIGN PATENT DOCUMENTS

JP 2004-505450 2/2004
WO WO 02/09180 1/2002

* cited by examiner

*Primary Examiner*—Hung V Ngo
(74) *Attorney, Agent, or Firm*—Kenyon & Kenyon LLP

(57) ABSTRACT

A housing for an electronic circuit is provided with a single-part seal for sealing a clearance space between a floor plate and a cover, through which exposed electrical conductors are led, which connect the circuit on the inside of the housing to the surroundings. The floor plate, the cover and the conductors are made of the same kind of material, e.g., a metal. The floor plate and the cover are made of aluminum and the conductors of copper.

11 Claims, 3 Drawing Sheets

HOUSING FOR AN ELECTRONIC CIRCUIT AND METHOD FOR SEALING THE HOUSING

BACKGROUND OF THE INVENTION

1. Field of the Invention

The present invention relates to a housing for an electronic circuit, e.g., a control unit, and to a method for sealing a housing of an electronic circuit.

2. Description of Related Art

A housing for a transmission control of this type is known in principle in the related art. These housings are typically mounted at a position within the transmission, at which they are permanently surrounded by transmission oil, and are exposed to a wide temperature range, such as from −40° C. to +150° C. To protect the electronic circuits mounted in the housings, it is necessary to develop the housings in such a way that they are able to resist the extreme environmental conditions described, and it is especially required that no diffusion of the oil or its components into the inside of the housing is possible. Plastic or metal parts of the housings, such as the floor plate or the cover, usually resist the environmental conditions described; in particular, they do not permit any diffusion of oil into the interior of the housing; the same applies to sealing measures that are typically used for these purposes.

With regard to sealing, there is, however, a problem with the transitions, or rather the gaps between individual parts of the housing, such as between the cover and the floor plate.

Additional gates of entry for possible diffusion into the interior of the housing may be, for example, the transitions between the surfaces of exposed electrical conductors and their immediate surroundings, when these conductors lead to the contacting of the electronic circuit located in the housing.

Various design attempts are known in the related art which, in each case, try to improve the tightness between the circuit traces and a medium surrounding them. One known possibility provides pressing the conductors into the form of pins, the pins having to have an accurately defined shape at high precision, in order to be able to be sealed from the surrounding medium. One alternative possibility provides surrounding the conductors by an elastic material which takes over the sealing function. However, both design approaches are able to be technically performed and are economically meaningful if only a few conductors are required to make connection of the electronic circuit to the outside of the housing, and the clearances between the conductors are relatively large.

BRIEF SUMMARY OF THE INVENTION

It is an object of the present invention to improve a seal for a housing for an electronic circuit, especially in the region where the electrical conductors for contacting the electronic circuit penetrate through the housing.

This object is attained by a single-part seal of a gap between the floor plate and the cover, through which the exposed electrical conductors are led, if applicable.

Single-part, in the sense of the present invention, means first that the seal for the coherent gap is not made up of various partial seals which, for their part, again have interfaces between one another. The single-part seal itself has direct contact with the surfaces of individual parts of the housing and/or with the surfaces of the electrical conductors. Single-part also means of necessity that the seal in the entire gap is formed of the same material.

The term "seal" is used in the specification as having the same meaning as the sealing compound in its final chemical and physical state. The seal or sealing compound functions, on the one hand, for sealing; but on the other hand, it is used in addition as an adhesive, using which it connects itself with individual surfaces of the housing or the exposed electrical conductors. Even on the assumption that the sealing compound as such is tight, even in the sense of diffusion-tight to, for instance, oil or oil components, one may see the critical places for a possible penetration of undesired substances into the interior of the housing, especially the transitions between the sealing compound and the adjacent surfaces of housing parts or of electrical conductors. This being the case, the tightness of the seal is also determined quite substantially by its adhesive quality to the bordering surfaces.

The single-part seal is advantageously designed in such a way that it seals the gap between the floor plate, the cover and also the conductors, if applicable. It includes, first of all, an individual seal for each individual conductor, that is, because of its adhesive effect, it ensures that no undesired substances are able to penetrate into the interior of the housing, especially at the border surfaces between the conductor surface and the seal. At the same time it is used for electrical insulation between adjacent conductors. The number of electrical conductors is irrelevant with regard to the expenditure for the implementation of the seal. Because of its adhesive effect, the seal produces a sealing also at the border surfaces to the floor plates and the cover that is analogous to that at the border surfaces to the surfaces of the conductors.

According to one advantageous embodiment of the housing, the floor plate, the cover and the conductors are made of the same material, especially of metals. According to the present invention, the floor plate, the cover and the conductors form a highly durable metal-to-adhesive bond. The floor plate and the cover are made of aluminum, and the conductors are made of a copper-containing material, e.g., copper or a copper alloy. The use of the same materials makes it advantageously possible to optimize the sealing compound in a very targeted way, with regard to a maximum adhesive effect or maximum tightness that can be striven for, especially in the transitional region between the seal and the respective bordering material. The use of the same materials also offers the advantage that the floor plate and the cover each expand or contract thermally in the same measure; in this manner one is able to avoid preventively mechanical stresses and possibly leakages resulting therefrom.

When different materials are used for the floor plate and the cover, which should not be fundamentally excluded according to the present invention, one nevertheless has to accept an only suboptimal sealing effect in the transitional region between the seal and one of the materials if the sealing compound has been selected to achieve an optimal tightness in the transition to the other material.

The exposed or bare conductors are advantageously led in a frame, and are positioned in a fixed manner with respect to one another, in this way. The frame is provided between the floor plate and the cover of the assembled housing. By an appropriate geometrical embodiment of this frame, it is possible to specify the positions and/or the clearances of the floor plate, the cover and the exposed conductors relative to one another, in the assembled housing.

A particularly precise setting with respect to maintaining the predetermined relative clearances of the floor plate, the cover or the conductors from one another is achieved by the frame having suitably dimensioned and positioned spacers.

The floor plate of the housing can advantageously have a depression for accommodating sealing compound; in this way, a comparatively low type of construction of the housing can be implemented.

The frame advantageously has an opening or recess in the region of the depression of the floor plate which, together with the floor plate, or rather its depression, at least partially borders the gap. Into this gap one may then apply liquid sealing compound, so that it has the possibility of expanding into all the branchings of the gap.

The electrical conductors may be developed as pressed screen strips.

The object named above is also attained by a method for sealing a housing for an electronic circuit. The advantages of this method correspond to the advantages mentioned above in connection with the claimed housing.

DETAILED DESCRIPTION OF THE INVENTION

Figure 1:
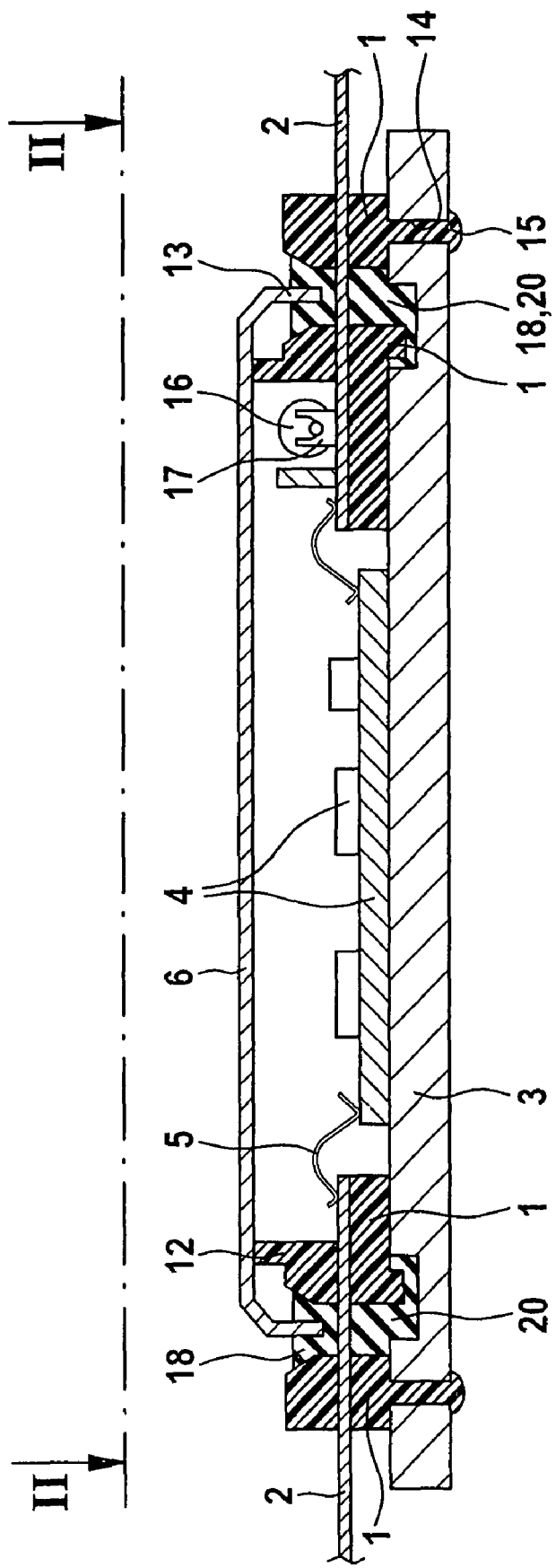
FIG. 1 shows a first exemplary embodiment for the construction and the sealing of a housing for an electronic circuit, in a longitudinal section.

In all the figures the same reference numerals designate the same elements.

FIG. 1 shows a first exemplary embodiment for the housing, sealed according to the present invention, of an electronic circuit 4. The electronic circuit is made up of a circuit substrate, e.g., a low temperature cofired ceramic LTCC or a hybrid which is equipped with electronic components. Floor plate 3 is preferably formed of metal; it is then able to be used as a cooling surface for dissipating heat that is generated by electronic circuit 4 during its operation.

Electronic circuit 4 is surrounded by a frame 1, e.g., a plastic frame, in which electrical conductors 2 in the form of pressed screen strips are embedded. Floor plate 3 has at least two bores 14 for accommodating studs 15 that are extruded on the plastic frame. By the engagement of studs 15 in bores 14, plastic frame 1 is positioned relatively to floor plate 3 and to electronic circuit 4, that is connected rigidly to floor plate 3, in the plane of floor plate 3. In order also to fix frame 1 in a direction that is perpendicular to floor plate 3, a rivet head can be formed onto each stud 15, for instance, using a thermal process (such as hot-cold caulking). The contacting of electronic circuit 4 to electrical conductors 2 takes place by bonds 5.

If electrical conductors 2 extend by a piece into the interior of the housing, before being bonded to the electronic circuit, this advantageously makes possible the insertion of additional electronic components into the interior of the housing, next to the components which represent electronic circuit 4. Inside the housing, these additional components may be welded directly to electrical conductors 2, and through these they may be contacted towards the exterior of the housing, or even further inwards to electronic circuit 4. For example, in FIG. 1 such an additional component in the form of a wire component 16 is shown welded into a bifurcated contact 17 that is formed of pressed screen strips. By providing the described circuit traces 2 that extend sufficiently far into the interior of the housing, it is advantageously possible to save on valuable surface on the circuit substrate, or to be able to use components that are not able to be fixed or contacted on the circuit substrate.

To close the housing, a cover 6 is used, which rests on spacers 12 that are provided, for instance, on plastic frame 1 at a suitable location. To seal the housing, a liquid sealing compound 20 is filled into a groove 18 that is bordered by floor plate 3 and plastic frame 1. The filling in of the sealing compound may take place under a vacuum, in order to prevent bubble formation within the sealing compound and to prevent a worsening of the latter's tightness that would go along with it. The level to which the sealing compound is filled into groove 18 is advantageously selected in such a way that a vertical section 13 of cover 6 dips sufficiently deeply into the sealing compound and is enclosed by it. In this connection, sufficiently deep means that a sufficient surface remains for the acting, by the sealing compound, upon section 13 of the cover, in order to be able to exert a retention force upon it in the form of an adhesion effect, so that the cover is securely held in its position, based on this adhesion effect. After the previously fluid sealing compound has solidified, or rather is no longer able to be worked, there is formed a single part seal.

For the tightness of the housing, particularly the adherence of the sealing compound to the parts surrounding it is relevant, that is, especially to the floor plate, electrical conductors 2 and the cover. In order to achieve a maximum tightness of the housing, it is therefore recommended if not only conductors 2, but also floor plate 3 and also cover 6 of the housing are all made of the same material, preferably a metal. This has the advantage that, in this case, the sealing compound is able to be selected with respect to a maximum adhesive effect to the uniformly used material, that is, for instance, a metal. In response to the use of different materials for floor plate 3 and cover 6, for instance, in response to using a floor plate of metal and a cover 6 of plastic, an only suboptimal tightness with respect to adherence to one of the materials has to be accepted if the sealing compound was optimally selected with the other material in mind.

Figure 2:
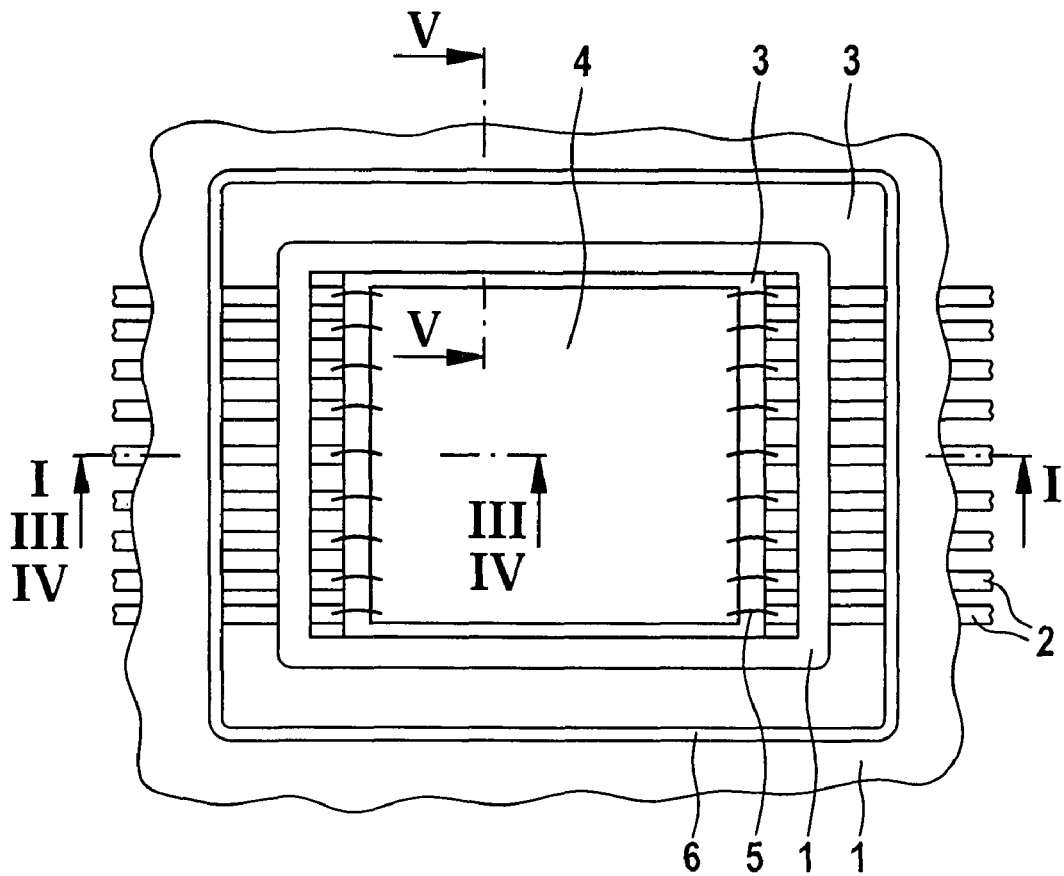
FIG. 2 shows the construction of the housing for the electronic circuit according to the present invention, in a top view.

FIG. 2 shows a top view onto the housing shown in FIG. 1. The reference numerals in FIG. 2 represent the components of the housing explained in FIG. 1 using the same reference numerals. What should be mentioned especially is only that, as may be seen from FIG. 2, not only one conductor, but typically a plurality of electrical conductors 2 penetrate through the housing, in order to connect electronic circuit 4 to the outside.

Figure 3:
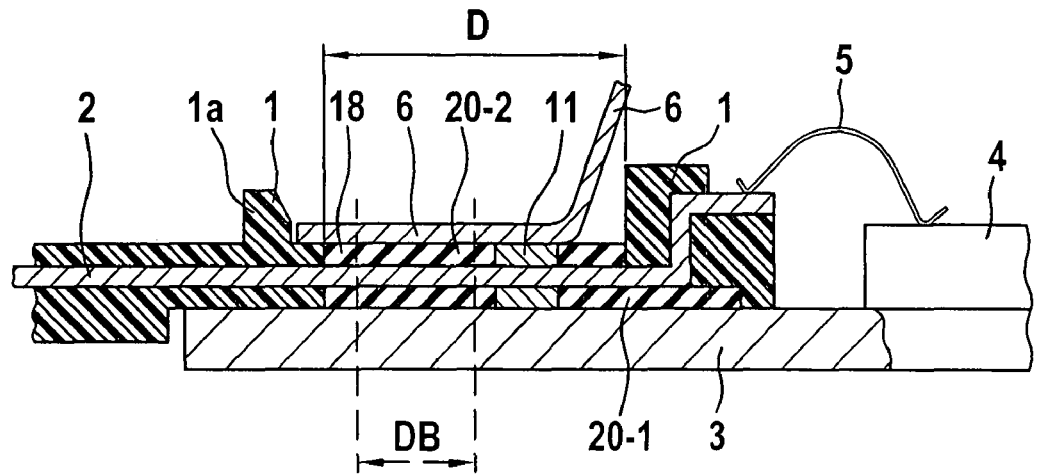
FIG. 3 shows a second exemplary embodiment for the construction and the sealing of the housing in a longitudinal section.

FIG. 3 shows a second exemplary embodiment for the construction and sealing of the housing. By contrast to the first exemplary embodiment shown in FIG. 1, the second exemplary embodiment shown in FIG. 3 is suitable especially for the use of a sealing compound that has a higher viscosity compared to that used in the first exemplary embodiment. Now, the higher viscosity no longer permits the pouring of the sealing compound as in the first exemplary embodiment, but instead, it calls for the application of the sealing compound in the form of sealing compound beads, first of all on floor plate 3. Frame 1 is pressed into the thus formed first sealing compound bed 20-1, and frame 1, because of its specific geometrical design, specifies especially clearance d between floor plate 3 and conductors 2. In FIG. 3, exposed conductor 2 would basically hover freely over a relatively large area D, which would involve the danger of developing a short circuit in response to an also metallic development of floor plate 3. A short circuit would occur if this freely hovering conductor 2 came into contact with metallic floor plate 3. In order to prevent such a short circuit, the second exemplary embodiment provides a spacer 11, which, for one thing, is developed between floor plate 3 and conductor 2. In addition, spacer 11 is also developed above conductor 2, in order later, when cover 6 is closed, also to prevent another type of possible short circuit between cover 6 and conductor 2. The gap between frame 1 and support element 11 above circuit traces 2 is filled up before the closing of the housing with sealing compound, again, for instance, in the form of sealing compound beads. Second sealing compound bed 20-2 thus formed is able to be applied before first sealing compound bed 20-1 has dried out or is no longer able to be worked. In particular, between individual conductors 2, first and second sealing compound bed 20-1, 20-2 meet, and connect there with each other to form a single-part seal. The second sealing compound bed is preferably extended also to an upper side of support location 11, as well as to an upper side of frame 1 in the region of stop 1a. Cover 6 is then pressed into this sealing compound bed 20-2, however, not before electrical conductors 2 have been bonded to the electronic circuit. Stop 1a, together with support location 11, ensures a constant clearance of cover 6 from conductor 2. Excess sealing compound may rise in an annular space between cover 6 and plastic frame 1. Thus, overall, a sealing region DB is created in the second exemplary embodiment.

Support location 11 may be developed from plastic, exactly like frame 1, and is integrated into it.

Figure 4:
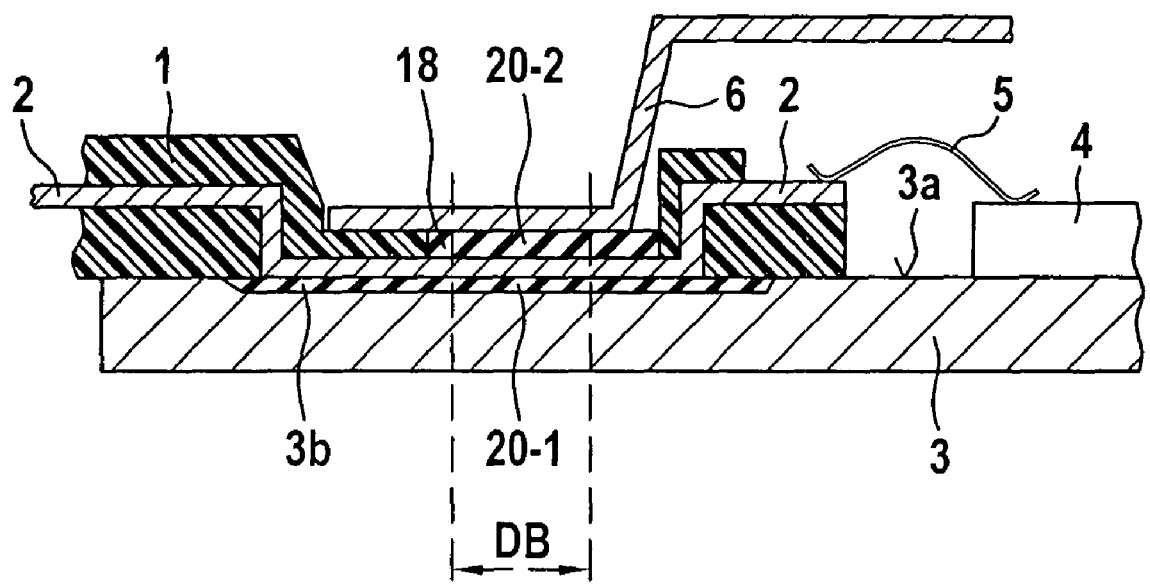
FIG. 4 shows a third exemplary embodiment for the construction and the sealing of the housing in a longitudinal section.

FIG. 4 shows a third exemplary embodiment for the constructive design of the gap region between cover 6, circuit trace 2 and floor plate 3. In the third exemplary embodiment there is a requirement to hold the overall height of the housing to as low as possible. Therefore, conductor 2 is lowered, in the region between cover 6 and floor plate 3 in its run, e.g., to the height of surface 3a of floor plate 3. In order to prevent direct contact of conductor 2 with floor plate 3 in this region, that is, to prevent an electrical short circuit, floor plate 3 has a depression 3b in this region. This depression 3b has a double function, just as support location 11 had in the second exemplary embodiment: Both ensure a predetermined thickness for the sealing compound in this region, and at the same time they prevent a short circuit between conductors 2 and floor plate 3 if floor plate 3 is made of metal.

In all the three exemplary embodiments named, groove 18, formed by frame 1 or spacer 11 and floor plate 3, is developed for accommodating the sealing compound, e.g., in the form of a closed line curve, all around electronic circuit 4. This groove 18 is only crossed point-by-point by conductor 2, in this context.

Figure 5:
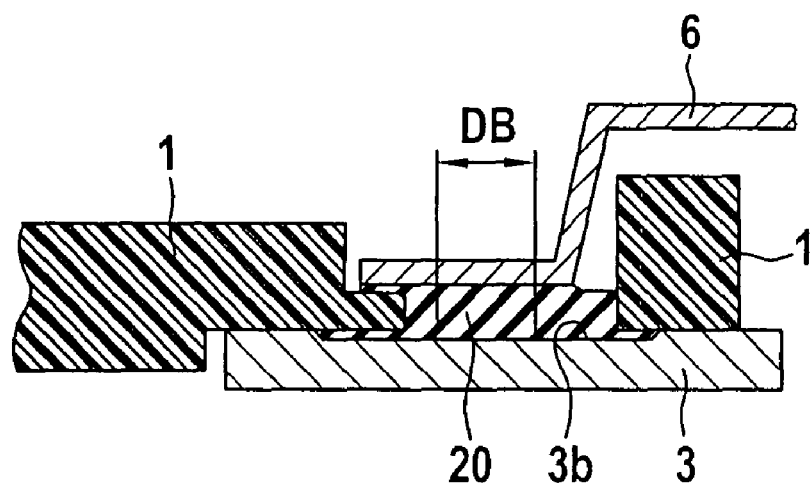
FIG. 5 shows an example for the construction and the sealing of the housing in a region without electrical conductors.

Basically, depending on the number of conductors, there is a plurality of regions in which this groove is not crossed by conductor 2. The longitudinal section through such a region, indicated in FIG. 2 by section V-V, is shown in FIG. 5. FIG. 5 differs from the design of the intermediate region between floor plate 3 and cover 6 of the third exemplary embodiment, shown in FIG. 4, only in that conductor 2 does not cross groove 18, as was pointed out.

It is common to all the exemplary embodiments shown in FIGS. 1, 3-5 of the present invention that sealing region DB for the housing is always implemented by a metal-sealing compound connection if cover 6 and floor plate 3 are each made of metal. On the assumption that the sealing compound itself is tight, especially to environmental conditions within a transmission, and in particular does not permit any diffusion of oil into the interior of the housing, the regions that remain as being possibly not tight are the transitions between the sealing compound itself and the surfaces of the adjacent parts of the housing. In the three exemplary embodiments shown in FIGS. 1, 3 and 4, the following layer construction appears in the vertical direction: floor plate 3—sealing compound 20—conductor 2—sealing compound 20—cover 6. For the longitudinal section shown in FIG. 5, the following layer sequence comes about: Floor plate 3—sealing compound 20—cover 6. Only the adhesion of the sealing compound in these transitions to the floor plate, the conductor and the cover is responsible for the tightness of the housing, in the last analysis. The tightness is able to be optimized by developing not only conductor 2, but also floor plate 3 and cover 6 of the same kind of material, preferably a metal, because then the sealing compound is able to be selected with regard to an optimal adhesion or adhesive effect to this same kind of material. In the three exemplary embodiments described, the adhesion of the sealing compound to frame 1 is unimportant as far as the quality of the tightness is concerned. Therefore, the sealing compound is advantageously selected especially with regard to an optimal tightness in the transition to metal. The development of floor plate 3 and cover 6 of a same material, preferably aluminum, also has the advantage that floor plate 3 and cover 6 expand in the same way in response to the heating of the housing, especially during the operation of the electronic circuit. By contrast to a material mix that is also theoretically possible, that is, for example, the combination of a plastic cover with a metallic floor plate, by using the same materials, bending of the floor plate and crack formation between cover 6 and floor plate 3 is able to be prevented. Both the bending of floor plate 3 and the formation of cracks would possibly lead to leakage in the housing, to a lack of heat dissipation or to a fracture in the circuit substrate, which, in each case, would result, of necessity, in the malfunction of the entire control unit.

What is claimed is:

1. A housing for an electronic circuit having a plurality of electrical contacts leading to the outside of the housing via individual electrical conductors, comprising:
   a floor plate;
   a cover;
   a seal between the floor plate and the cover;
   wherein:
      the seal is configured as a single part for sealing a gap between the floor plate and the cover;
      the electrical conductors are led in a frame and are positioned fixedly with respect to one another, the frame being situated between the floor plate and the cover; and
      the frame defines at least one of relative positions and relative clearances of the floor plate, the cover and the electrical conductors with respect to one another in the housing.

2. The housing as recited in claim 1, wherein the floor plate, the cover and the electrical conductors are made of the same material.

3. The housing as recited in claim 2, wherein the floor plate and the cover are made of aluminum.

4. The housing as recited in claim 2, wherein the electrical conductors are made of a copper-containing material.

5. The housing as recited in claim 1, wherein at least one of the floor plate, the cover and the frame has at least one of a spacer and a stop, and wherein the at least one of the spacer and the stop is positioned to maintain a predetermined clearance of the electrical conductors from one of the floor plate and the cover when the housing is closed.

6. The housing as recited in claim 1, wherein the floor plate has a depression for accommodating a part of the seal.

7. The housing as recited in claim 1, wherein the frame has a recess, and wherein the recess, together with the floor plate, at least partially borders the gap.

8. The housing as recited in claim 1, wherein the electrical conductors are configured as a pressed screen strip.

9. A method for sealing a housing for an electronic circuit having a plurality of electrical contacts leading to the outside of the housing via individual electrical conductors, and the housing including a floor plate, a cover and a seal between the floor plate and the cover, the method comprising:
   providing the seal in a single-part form in a gap between the floor plate and the cover; wherein:
      the electrical conductors are led through the seal; and
      the providing of the seal takes place during the assembly of the housing and includes the following steps:
         applying a first sealing compound bed to a surface of the floor plate in the surroundings of the electronic circuit on the floor plate;
         putting a frame having the electrical conductors onto the first sealing compound bed, whereby a part of the first sealing compound bed wells up between the electrical conductors;
         applying a second sealing compound bed to a clearance space above the electrical conductors; and
         inserting the cover of the housing into the second sealing compound bed.

10. The method as recited in claim 9, wherein the cover of the housing is inserted into the second sealing compound bed only after the electrical conductors have been bonded to the electronic circuit.

11. A method for sealing a housing for an electronic circuit having a plurality of electrical contacts leading to the outside of the housing via individual electrical conductors, and the housing including a floor plate, a cover and a seal between the floor plate and the cover, the method comprising:
   providing the seal in a single-part form in a gap between the floor plate and the cover; wherein:
      the electrical conductors are led through the seal; and
      the providing of the seal takes place during the assembly of the housing and includes the following steps:
         applying a frame to the floor plate at a predetermined position, wherein the electrical conductors are led through the frame and are fixedly positioned within the frame with respect to one another, and bonding the electrical conductors to the electronic circuit, wherein the frame has at least one of spacers and stops;
         filling fluid sealing compound into a groove defined by the surface of the floor plate and a recess in the frame; and
         closing the housing by positioning the cover on the at least one of the spacers and stops of the frame, wherein the edge of the cover penetrates into the fluid sealing compound in the groove.

* * * * *